United States Patent [19]

Schmider

[11] 3,957,547
[45] May 18, 1976

[54] METHOD FOR DOPING SEMICONDUCTORS IN CENTRIFUGE

[75] Inventor: Paul Schmider, Munich-Oberfoehring, Germany

[73] Assignee: Beckman Instruments G.m.b.H., Munich, Germany

[22] Filed: Apr. 8, 1974

[21] Appl. No.: 458,972

[30] Foreign Application Priority Data
April 17, 1973 Germany ........................ 2319481

[52] U.S. Cl. ............................... 148/186; 118/49.1; 148/188; 427/85
[51] Int. Cl.² ....................................... H01L 21/225
[58] Field of Search ........... 148/186, 188; 117/93.2, 117/101, 106; 118/52, 49.1, 49.5, 50.1, 620

[56] References Cited
UNITED STATES PATENTS

| | | |
|---|---|---|
| 2,996,418 | 8/1961 | Bleil ............................... 117/93.2 X |
| 3,301,213 | 1/1967 | Grochowski et al. ........... 117/93.2 X |
| 3,594,227 | 7/1971 | Oswald .......................... 117/93.2 X |
| 3,713,883 | 1/1973 | Lien ............................... 117/101 X |
| 3,806,360 | 4/1974 | Briody ........................... 117/101 X |

Primary Examiner—L. Dewayne Rutledge
Assistant Examiner—J. M. Davis
Attorney, Agent, or Firm—R. J. Steinmeyer; P. R. Harder

[57] ABSTRACT

A semiconductor material is doped or alloyed under vacuum with an impurity by thermal decomposition and by sedimentation resulting from centrifugal force. The doping material is alternatively applied by evaporation before being subjected to centrifugal force and may be heated up to the melting point before completion of the centrifugal action. A centrifuge is provided having a thermal insulating layer between the outer wall of a rotor and a support for basic semiconductor material to be doped. The doping impurity material to be evaporated onto the basic solid state material is placed in the center of the centrifuge rotor.

15 Claims, 2 Drawing Figures

METHOD FOR DOPING SEMICONDUCTORS IN CENTRIFUGE

BACKGROUND OF THE INVENTION

The invention relates to a method for the incorporation of an impurity in a solid state basic material, more particularly for doping and alloying semiconductor basic material, and an apparatus for carrying out this method.

The doping of semiconductor basic material for the production of semiconductor components such as diodes, transistors and thyristors, is carried out at the present time substantially in accordance with two known methods, that is to say diffusion technology and the so-called ion implantation method. The doping of n- and p-conducting semiconductor basic material respectively with trivalent and pentavalent impurity atoms for the production of a pn-junction using diffusion technology is described in detail for instance in publications of W. R. Runyan with the title "Silicon Semiconductor Data", A. Moeschwitzer with the title "Halbleiterelektronik" and H. F. Wolf with the title "Silicon Conductor Data". The doping brought about by so-called ion implantation is described for example in the article by E. F. Krimmel in "Internationale Elektronische Rundschau" 3/73 with the title "Mikroelektronik stoeszt in neue Dimensionen vor" and in a publication of L. Ruge and J. Frank with the title "II. International Conference on Ion Implantation in Semi-conductors".

Neither of the two prior art methods of doping is completely satisfactory since they have a series of disadvantages and are subject to specific limitations.

With the prior art diffusion technology, it is in principle only possible to diffuse into the semiconductor basic material only impurity atoms which are soluble in such basic material. Furthermore, in the case of the diffusion process there is a concentration profile of doping towards the interior of the semiconductor so that the depth of the diffusion layer is disadvantageously influenced. Further disadvantages of this known diffusion method lie in that owing to the breadth of the diffusion layer at the pn-junction parasitic capacitances appear and as a result the utility of the pn-junction is limited especially in the high frequency range. A further disadvantage is that the diffusion also progresses in the surface of the semiconductor material and that in the case of double diffusion the diffusion processes are not independent from each other and this is connected with the disadvantageous effect of the "emitter push". These disadvantages apply basically also for the further development of diffusion technology known as "field-aided diffusion", in the case of which the diffusion of the doping ions into the basic material is encouraged by an applied electric field. This development involved substantially a doubling of the diffusion coefficient without, however, the above-observed basic disadvantages of diffusion technology being dealt with.

The disadvantages of the prior art ion implantation method reside in that it requires a large expenditure as regards apparatus and more particularly that on bombardment with the high energy ions crystal lattice faults are produced which must be removed later on by heat treatment, and that there is a particularly strong dependence of the depth of penetration of the ions on the orientation of the crystal.

These defects in the case of the prior art doping methods have led to a substantial requirement for doping techniques based on another principle. The aim of the invention is the creation of a method for doping or alloying semiconductor basic material, and generally for the incorporation of any impurity in a solid state basic material, which while keeping to a realistic expenditure as regards apparatus makes possible a selective doping, which can be exactly monitored or controlled as regards the extent in area and depth of penetration, of impurity substances into the basic material while obtaining the sharpest possible doping profile and can be modified in a very simple manner to suit the many different conditions and circumstances in accordance with the various doping substances and basic materials.

SUMMARY OF THE INVENTION

For achieving the foregoing aim, there is the provision in accordance with the basic principle of the invention that the incorporation of the impurity substance atoms, molecules or ions into the basic material is carried out by way of solid state sedimentation under the action of high gravitational accelerations produced by centrifugal force.

This method in accordance with the invention can be carried out in the rotor of a conventional ultracentrifuge which is modified for use in accordance with the invention and can be evacuated.

The invention is based on the discovery that under the influence of a high centrifugal acceleration $\omega^2 r$ of more than $10^8$ cm/sec$^2$ a sedimentation or a flotation of the doping substances in the semiconductor material is initiated provided that the reciprocal of the partial, specific volume of the doping substances differs from the density of the semiconductor crystal.

The speed of the solid state sedimentation under the centrifugal force is in accordance with the elementary theory of ultracentrifugation (see for example H. G. Eliss, "Ultrazentrifugen Methoden", Beckman Instruments GmbH, Munich 3rd edition 1969) defined by the following equation:

$$\frac{dr}{dt} = \frac{(1 - \delta_1 \overline{+V_2}) M_2 \omega^2 r}{RT} \times D$$

in which:

$dr/dt$ = the speed of sedimentation
$\delta_1$ = the density of the host lattice
$+V_2$ = the partial specific volume of the impurity atoms
$\omega$ = the angular velocity
$r$ = the distance from the center of rotation
$R$ = the universal gas constant
$T$ = the absolute temperature in °K
$D$ = the "phenomenological" diffusion coefficient
$M_2$ = the molecular weight of the doping atoms In accordance with a preferred form of the invention there is the provided that the temperature of the doping substance and/or of the basic material in the centrifuge rotor is raised at least for a short time to such an extent that the doping substance becomes liquid and the numerical value of the diffusion constant is greater than $10^{-10}$ cm$^2$/sec so that higher sedimentation speeds than those at normal temperature are attained.

The basic aim of doping a semiconductor material resides, as is known, in incorporating impurity atoms with a higher or lower valency in the host lattice and the necessary depths of penetration are limited as a general rule to from one to a few microns. For this purpose the doping substance must be deposited on the semiconductor surface so that a certain surface concentration of the impurity material is produced. In accordance with convenient forms of the method in accordance with the invention and a device for carrying it out, this deposition occurs within the centrifuge rotor following a conventional method either by thermal decomposition of compounds of the doping substance (for instance $P_2O_5$ for the deposit of phosphorous) on the heated substrate surface or by direct thermal evaporation of the material (for instance for the doping substance Au and Cu) from the rotor center. After the termination of this deposition the rotor is accelerated so that between the impurity atoms on the surface and the semiconductor lattice of the basic material a high gravitational acceleration is effective. If in some cases the solid state sedimentation should be too small at ambient temperature in accordance with a preferred embodiment, as mentioned, the temperature is raised for a short time by means of a heating device provided in the apparatus in accordance with the invention so that in accordance with the above-mentioned equation owing to an increase in the strongly temperature dependent diffusion coefficient D, a sedimentation speed of a few microns per hour is attained.

The natural diffusion of the doping material present in the case of the centrifuge treatment in accordance with the invention become associated in this respect with the numerically substantially more significant sedimentation movement of the atoms so that the desired degree of doping is concluded after a comparatively short time. The (conventional) initial surface concentration of the doping substance moves in this respect as a coherent fraction into the interior of the semiconductor so that a narrow doping profile remains preserved and as a result the abovementioned disadvantage of conventional diffusion technology are overcome. A further increase in the sedimentation speed of the doping ions can be obtained in accordance with a further advantageous form of the invention by the application of a magnetic field which is substantially parallel to the axis of rotation.

The invention is also suitable for carrying out an alloying of semiconductor basic material, and in this respect it is to be considered to be particularly advantageous that the two materials pervade each other intimately and produce a homogenous alloying layer. Such an alloying treatment can serve for example for the production of ohmic connection contacts on the active zones of the semiconductor components.

Finally the invention is also suitable for bonding conductors on the basic material for example for reproduction of a bond between the fine gold or gold alloy "whisker" wires, in the case of which all connections can be fixed in a single operating step so that the manual work, still frequently necessary today, with micromanipulators can be dispensed with.

In accordance with a particularly advantageous form of the invention the doping of the semiconductor basic material, the alloying of the ohmic connection contacts and the attachment of the external whisker supply wires with the active zone can be carried out within the centrifuge rotor in treatment steps in accordance with the invention following one after the other, and for the varied different treatments specified different gravitational accelerations are necessary, that is to say the highest values of acceleration are used for the doping treatment and the lowest ones are used for the bonding treatment. As regards the practical values coming into question for the speeds of rotation of the rotor and their relative graduation for the varied types of treatment mentioned above it is possible to use for example the following speeds of rotation: doping treatment, for example approximately 60,000 rpm, alloying treatment, for example 40,000 rpm, bonding treatment, for example approximately 20,000 rpm. Since the gravitational accelerations corresponding to the speeds of rotation correspond to the squares of the speeds of rotation, there are sufficient safety margins between the gravitational accelerations connected with the varied types of treatment in order to avoid an impairment of the doping distribution obtained with the doping treatment in the semiconductor body on account of the following alloying or bonding treatment.

The respective duration of the centrifuge treatment is determined, for a given basic material and a given doping substance in accordance with the desired depths of doping and can be influenced within certain limits by a suitable choice of the temperature. The durations of treatment can be in the order of magnitude of several minutes to several hours.

The invention also relates to a centrifuge apparatus for carrying out the method as explained above. As mentioned the method in accordance with the invention can in principle be carried out in a suitably modified rotor of conventional centrifuges which can be evacuated, more particularly in ultracentrifuge. In accordance with the principles of this invention there may be provided a centrifuge rotor having means placed along the inner wall for holding and supporting the basic material to be treated. Further, if desired, between the basic material and the inner wall of the rotor a thermal insulating layer can be provided which has flat support surfaces for radially supporting the basic material. A heating device may also be utilized either internally or externally to the rotor and for certain applications evaporation source means may be provided for introducing the doping or alloying substance into the rotor for deposition upon the basic material.

In accordance with a particularly advantageous form of the apparatus in accordance with the invention the rotor may be mounted in a rotatable manner in a vacuum tight rotor chamber, which is connected with a vacuum pump device and with a gas metering device for the regulated supply of a gaseous compound of the doping substance, which can be thermally decomposed, the interior of the rotor communicating with the rotor chamber via openings.

BRIEF DESCRIPTION OF THE DRAWINGS

In what follows embodiments of the invention will be described with reference to the drawing.

DETAILED DESCRIPTION OF THE INVENTION

Figure 1:
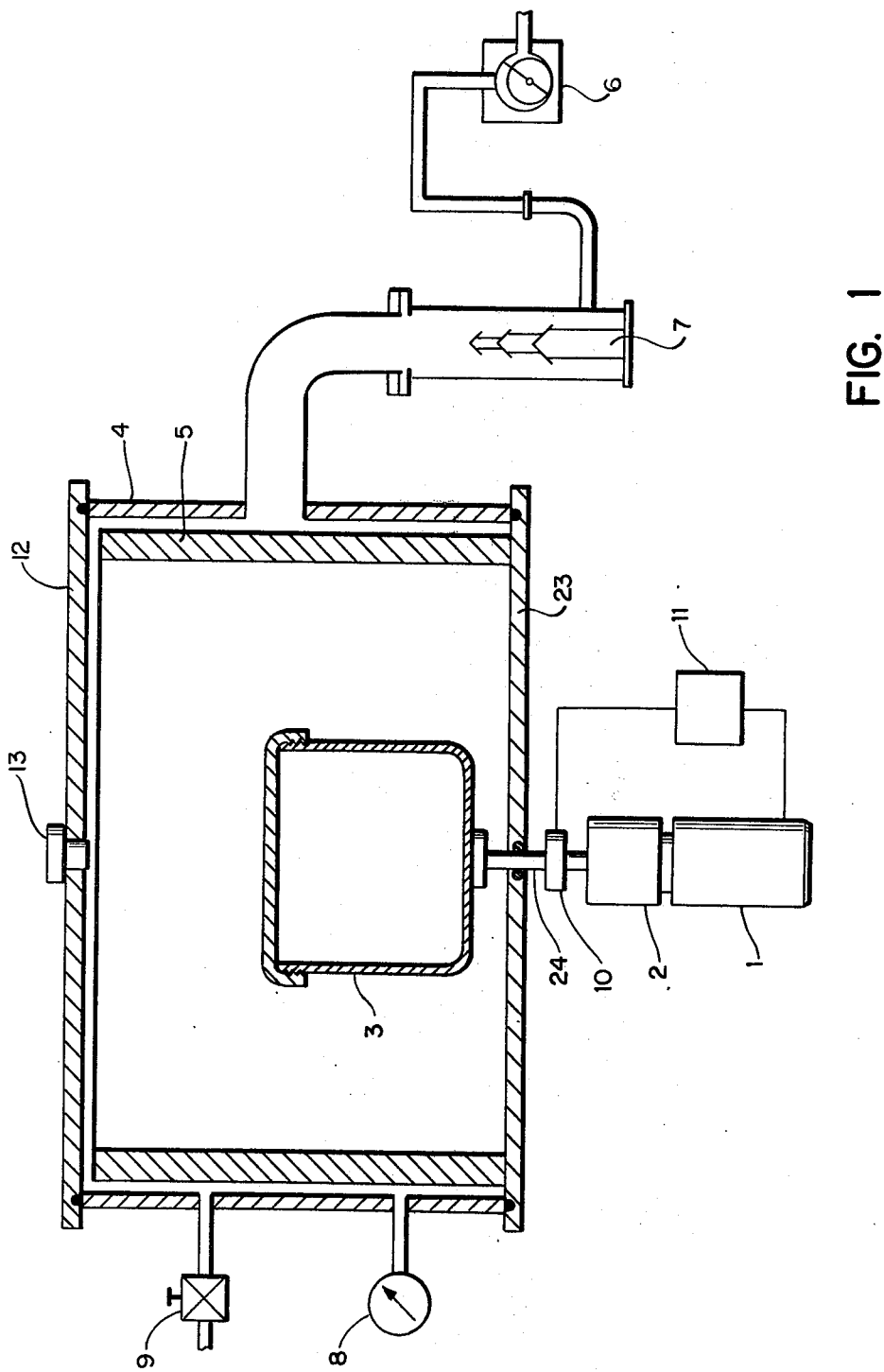
FIG. 1 shows diagrammatically an embodiment of the invention in the form of an apparatus for carrying out the method in accordance with the invention.

The centrifuge arrangement shown diagrammatically in FIG. 1 for carrying out the method in accordance with the invention has a drive motor 1, which via gearing 2 drives the motor 3 of the centrifuge apparatus. The rotor 3 is arranged in a vacuum tight rotor chamber 4, and an armour ring 5 is provided between them to avoid danger to the operating person in the case of a rotor smash-up. The rotor 3 is mounted on a rotor shaft 24 which extends through a vacuum seal in the bottom plate 23 of the rotor chamber.

The rotor chamber 4 — and the rotor 3 arranged in it — can be evacuated by means of a vacuum pump system, which in the specific embodiment shown comprises a rotary pump 6 as a prevacuum pump and a diffusion pump 7; at 8 a vacuum indicating device is indicated; reference numeral 9 indicates a gas metering valve for the purpose of controllably setting and maintaining a desired gas atmosphere in the rotor chamber 4 and in the interior of the rotor drive, which preferably communicates with the interior of the rotor 3.

The rotor drive has in a conventional manner means for controlling the speed of rotation with a tachometer sensor 10 mounted on the rotor drive shaft 24 and a speed of rotation regulation device 11 acting on the drive motor 1. The control of a speed of rotation is simultaneously constructed to prevent excess speeds of rotation of the rotor 3, which can lead to destruction of the apparatus.

The lid 12 of the vacuum chamber 4 is provided with an electrically insulated bushing or grommet 13 for the electrical supply lead 19 (FIG. 2) for the heating of the rotor. The measurement of the temperature of the rotor 3 can be carried out in any suitable manner, for example radiometrically by means of an infrared detector responding to heat radiation from the rotor.

Figure 2:
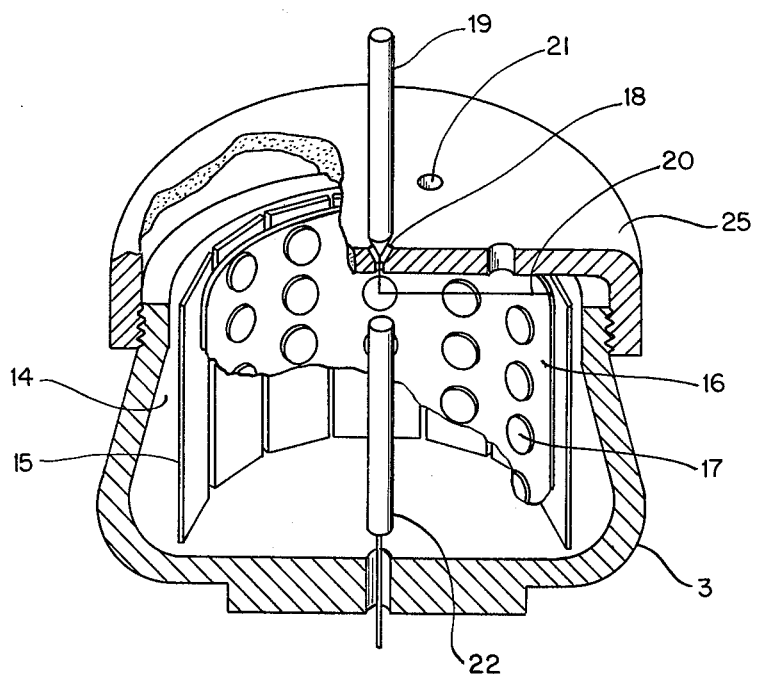
FIG. 2 shows a sectional and partly broken away detailed view of an embodiment of the rotor of a centrifuge apparatus in accordance with the invention.

FIG. 2 shows an embodiment of a centrifuge rotor, suitable for the purposes of the present invention, with specfic details. The rotor denoted by the general reference numeral 3 is made as a round body of titanium and can in its construction be made substantially in accordance with conventional zonal rotors. On the inner wall 14 of the rotor flat segment surfaces 15 of a thermally insulating material, which at the same time is mechanically strong, are provided. They are preferably made of mechanically strong sintered ceramic material. On these flat surfaces 15 there is a thin heating strip or band 16, preferably of nickel, which has holding means (not shown in detail), for the semiconductor basic material wafers which are to be treated in accordance with the invention and are denoted diagrammatically by reference numeral 17. The supply of current for the heating strip 16 is carried out in the embodiment shown via a graphite rod 19 connected in the conical or point bearing 18 centrally with the rotor 3 and having a further electrical connection 20. The rotor 3 can for example be grounded.

In the rotor lid 25, which is connected by screw means with the main body of the rotor 3, openings 21 are provided which communicate with the interior of the rotor chamber 4 (see FIG. 1) in such a manner that during operation of the centrifuge the rotor can be evacuated together with the rotor chamber 4. Via these connecting openings 21 it is also possible to supply the gas atmosphere, which can possibly be adjusted via the gas metering device 9, into the interior of the rotor, for example for the purpose of bringing about the above-mentioned deposition of the doping substance by thermal decomposition of a gaseous compound of the doping material supplied via the metering device 9. Alternatively the predeposit of the doping substance onto the semiconductor wafer can be carried out by evaporation of a solid doping material or a solid doping compound and decomposition from the vapor phase; for this purpose a source of evaporation 22 is preferredly centrally provided in the rotor.

The segment plates 15 serve not only for thermal insulation but also simultaneously as flat support surfaces for the semiconductor basic material wafers 17 which are to be treated and support them to resist the high centrifugal forces occurring during use of the rotor with as little stress as possible.

The typical manner of operation of the apparatus described, for example for doping semiconductor basic material in accordance with the method in accordance with the invention can occur as follows:

After charging the centrifuge rotor with the semiconductor bodies to be treated and closing the apparatus, a suitable vacuum is generally produced for avoiding undesired contamination in the rotor chamber and therefore in the interior of the rotor. Subsequently follows a so-called "predeposition"-method step including deposit of the respective doping substance on the semiconductor bodies. Depending on the desired doping substance this deposition can for example be carried out by thermal decomposition on the heated substrate surface of a gaseous compound of the doping material which is supplied via the gas metering device 9 into the rotor chamber and therefore into the interior of the rotor, (as for example in the case of doping with phosphorus by deposition of the phosphorus by way of thermal decomposition of $P_2O_5$), or by direct thermal evaporation of the material from the source of evaporation 22 coming from the rotor shaft. After the conclusion of this deposition the rotor is accelerated so that a high gravitational acceleration becomes effective between the impurity atoms on the surface of the semiconductor wafer 17 and the semiconductor substrate which gravitational acceleration in accordance with the basic principle of the invention brings about the controlled or monitored penetration of the impurity substance into the host lattice of the semiconductor. If the solid state sedimentation should be too low the ambient temperature can be raised for a short time by means of a heating device in order to obtain a sufficient speed of sedimentation approximately in the order of magnitude of a few microns per hour. In some cases the doping material which has been predeposited on the surface of the semiconductor material can also be caused to melt before or during the centrifuge treatment by heating. In every case the natural diffusion, also present in the case of the method in accordance with the invention, of a doping material becomes superimposed with the numerically substantially greater sedimentation movement of the doping atoms so that the doping step can be concluded after a comparatively short time depending on the respective desired depths of penetration. Periods of centrifuging in the order of magnitude of a few minutes to hours are possible in accordance with specific factors (nature of the semiconductor basic material, the doping substance, desired depth of penetration etc.). In any case, by the present method in accordance with the invention it is possible to achieve a doping profile which in comparison with conventional diffusion technology is substantially narrower, since in the case of the method in accordance with the invention the known initial surface concentration of the doping material penetrates as a substantially coherent fraction into the interior of the basic material. In the manner already mentioned above it is possible, in order to enhance the operation and to increase the speed of sedimentation of the doping ions, to apply a magnetic field which is substantially parallel to the rotor axis (that is to say the magnetic field strength is perpendicular to the tangential speed and to the plane of rotation).

As already mentioned the method in accordance with the invention and the apparatus described above are suitable both for doping and also for alloying purposes and also for the bonding of conductors with the active zones of semiconductor components. In this respect, basically all the working operations mentioned can be effected successively one after the other in one and the same apparatus on the semiconductor compounds by producing for example firstly the internal pn-junctions by doping, following which alloying is used to produce the ohmic connecting contacts and then following this whiskers are bonded with the alloy contacts to produce the external supply lines. Since for the doping treatment the highest gravitational accelerations are required while for the alloying operations the medium gravitational accelerations are required and for the bonding the lowest ones are needed, it is possible to ensure by use of a suitable choice of the speed of rotation that the alloying and bonding treatment has practically no influence on the doping distribution previously produced. Thus, for example, as regards the order of magnitude for the doping the speed of rotation of 60,000 rpm can be used while for the alloying and the bonding speeds of rotation of 40,000 rpm and 20,000 rpm respectively can be used; since the centrifugal gravitational accelerations correspond to the squares of the speeds of rotation, there are sufficient safety margins between the various types of treatment so that a mutual impairment or interference of the different types of treatment can be avoided.

The method in accordance with the invention and the apparatus for carrying out has been explained above with reference to preferred embodiments. Naturally the invention is not limited to the manners of operation and forms of apparatus described. The basic principle of the invention is instead suitable for application in all cases in which an impurity substance is to be incorporated in a basic or host material, provided that the substance to be incorporated and the basic material differ in their mass or their partial specific volume sufficiently in order to ensure a speed of sedimentation, sufficient for practical application, of the impurity substance into the basic material with the gravitational accelerations which can be achieved with speeds of rotation which are technically practicable. As regards the actual construction of the centrifuge device, its control of the drive and regulation, it is possible to make use of the extensive experience which has been gathered in the construction of ultracentrifuges and also as regards the advanced state of semiconductor technology as regards the properties of the semiconductor basic material used. The doping substances and the controlled and monitoring of the parameters of the doping and alloying operations significant for the electrical properties of the semiconductor components.

What is claimed is:

1. A method of incorporating an impurity substance in a solid state basic material by doping or alloying semiconductor basic material with impurity substance in the form of atoms, molecules or ions wherein the improvement comprises subjecting the impurity substance to be incorporated to high gravitational acceleration acting against the solid state basic material whereby incorporation of the impurity substance into the solid state basic material is accomplished by solid state sedimentation.

2. The method of claim 1 wherein the high gravitational acceleration is produced by centrifugal force acting upon the material to be incorporated while the impurity substance lies radially inward from the solid state basic material in contact therewith.

3. The method defined in claim 2 wherein the basic material has a radially outward supported side and the impurity substance is deposited on the surface radially inward from the support side of the basic material prior to subjecting the impurity substance to centrifugal force.

4. The method defined in claim 3 wherein a centrifuge rotor is provided for supporting the basic material and the impurity substance is deposited thereon in the interior of the centrifuge rotor by thermal decomposition of compounds of the impurity substance.

5. The method defined in claim 3 wherein a centrifuge rotor is provided for supporting the basic material and impurity substance to be deposited is mounted within the centrifuge rotor and there evaporated for deposition on the surface of the basic semiconductor material.

6. The method defined in claim 3 wherein the centrifugal action is carried out under vacuum.

7. The method defined in claim 6 wherein the predeposition of impurity substance on the solid state basic material is carried out under vacuum.

8. The method defined in claim 3 wherein the impurity substance deposited upon the solid state basic material is softened before termination of the centrifugal action.

9. The method defined in claim 8 wherein the softening of the impurity substance is accomplished by heating.

10. The method defined in claim 9 wherein the impurity substance is heated to its melting point.

11. The method defined in claim 9 wherein the impurity substance is electrically heated.

12. The method defined in claim 11 wherein the impurity substance is heated by the heat of electric current conduction.

13. The method defined in claim 11 wherein the impurity substance is heated by electromagnetic induction.

14. The method defined in claim 1 wherein solid state basic material is subjected to a magnetic field acting in a direction of the axis of the centrifuge rotor.

15. The method defined in claim 3 wherein a centrifuge rotor is utilized for supporting the basic material and wherein successively: the basic material is doped with impurity substance during high speed rotation of the centrifuge, then the impurity substance is alloyed with the basic material during rotation of the rotor at an intermediate speed, and thereafter connection whiskers are bonded to the impurity substance during lower speed rotation of the rotor.

* * * * *